(12) United States Patent
Mao et al.

(10) Patent No.: US 9,966,408 B1
(45) Date of Patent: May 8, 2018

(54) IMAGE SENSOR WITH INVERTED SOURCE FOLLOWER

(71) Applicant: OMNIVISION TECHNOLOGIES, INC., Santa Clara, CA (US)

(72) Inventors: Duli Mao, Sunnyvale, CA (US); Dajiang Yang, San Jose, CA (US); Gang Chen, San Jose, CA (US); Vincent Venezia, Los Gatos, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days. days.

(21) Appl. No.: 15/791,191

(22) Filed: Oct. 23, 2017

Related U.S. Application Data

(62) Division of application No. 15/427,748, filed on Feb. 8, 2017, now Pat. No. 9,881,964.

(51) Int. Cl.
| | | |
|---|---|---|
| *H01L 21/00* | (2006.01) | |
| *H01L 27/146* | (2006.01) | |
| *H01L 21/265* | (2006.01) | |
| *H01L 29/10* | (2006.01) | |
| *H01L 29/08* | (2006.01) | |

(52) U.S. Cl.
CPC .. *H01L 27/14643* (2013.01); *H01L 21/26513* (2013.01); *H01L 27/1461* (2013.01); *H01L 27/1463* (2013.01); *H01L 27/14607* (2013.01); *H01L 27/14614* (2013.01); *H01L 27/14636* (2013.01); *H01L 27/14689* (2013.01); *H01L 29/0847* (2013.01); *H01L 29/1033* (2013.01)

(58) Field of Classification Search
None
See application file for complete search history.

(56) References Cited

U.S. PATENT DOCUMENTS 7,286,174 B1 10/2007 Neale et al.
7,663,167 B2 2/2010 Ladd
(Continued)

OTHER PUBLICATIONS

Kim et al., "A Wide Dynamic Range CMOS Image Sensor with Dual Capture Using Floating Diffusing Capacitor," Proc. IEEE Int. Image Sensor, pp. 90-93 (2007).
(Continued)

*Primary Examiner* — Thien F Tran
(74) *Attorney, Agent, or Firm* — Christensen O'Connor Johnson Kindness PLLC

(57) ABSTRACT

A method of image sensor fabrication includes forming a photodiode and a floating diffusion in a first semiconductor material, and removing part of an oxide layer disposed proximate to a seed area on a surface of the first semiconductor material. The method also includes depositing a second semiconductor material over the surface of the first semiconductor material, and annealing the first semiconductor material and second semiconductor material. A portion of the second semiconductor material is etched away to form part of a source follower transistor, and dopant is implanted into the second semiconductor material to form a first doped region, a third doped region, and a second doped region. The second doped region is laterally disposed between the first doped region and the third doped region, and the second doped region is a channel of the source follower transistor.

10 Claims, 3 Drawing Sheets

(56) References Cited

U.S. PATENT DOCUMENTS

| | | | |
|---|---|---|---|
| 7,728,277 B2 | 6/2010 | Stevens et al. | |
| 2005/0161713 A1* | 7/2005 | Rhodes | G01B 3/1056 257/292 |
| 2008/0283886 A1* | 11/2008 | Hynecek | H01L 27/14603 257/292 |
| 2013/0146747 A1* | 6/2013 | Hynecek | H01L 27/1464 250/208.1 |
| 2016/0150169 A1* | 5/2016 | Hynecek | H04N 5/374 348/308 |

OTHER PUBLICATIONS

Adachi et al., "A 200-μV/e—CMOS Image Sensor with 100-ke—Full Well Capacity," IEEE Journal of Solid-State circuits, vol. 43, No. 4, pp. 823-830 (2008).

U.S. Appl. No. 15/285,352, filed Oct. 4, 2016, 36 pages.

* cited by examiner

IMAGE SENSOR WITH INVERTED SOURCE FOLLOWER

REFERENCE TO RELATED APPLICATIONS

This application claims priority to U.S. patent application Ser. No. 15/427,748, filed Feb. 8, 2017, now pending. U.S. patent application Ser. No. 15/427,748 is hereby incorporated by reference.

TECHNICAL FIELD

This disclosure relates generally to semiconductor fabrication, and in particular but not exclusively, relates to CMOS image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

Automotive image sensors face the problem of LED flickering. Future automotive vehicle lights, traffic lights, and signs may be constructed with LEDs that are pulsed at 90-300 Hz with high peak light intensity. This requires that the minimum exposure time of image sensors to LEDs be kept over 10 ms. A very high full well capacity or very low light sensitivity may be needed to avoid image sensor pixels from becoming saturated and losing useful information.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1B:
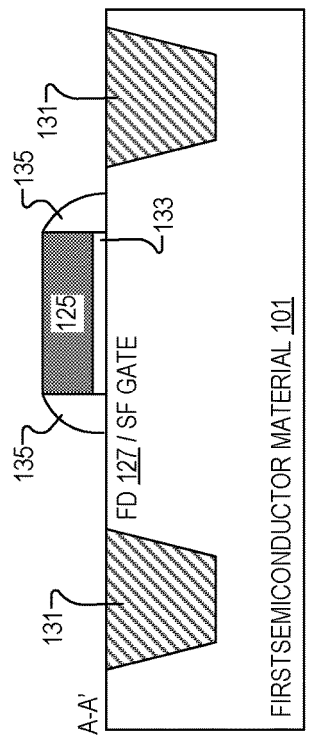
FIG. 1B is a cross sectional illustration of the image sensor in FIG. 1A as cut along line A-A', in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with an inverted source follower are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 1C:
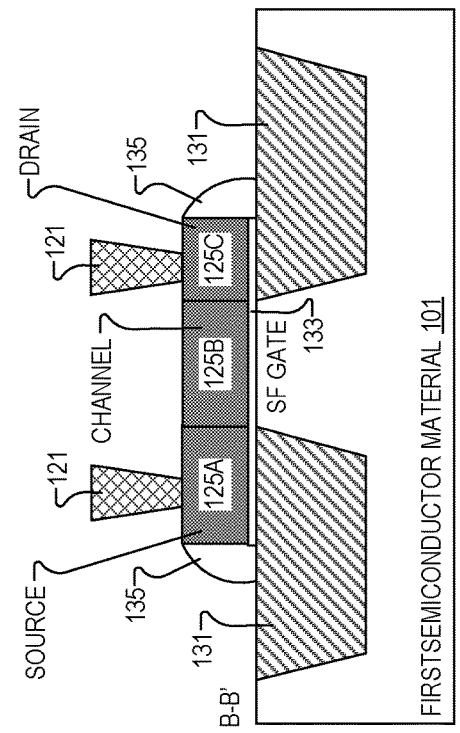
FIG. 1C is a cross sectional illustration of the image sensor in FIG. 1A as cut along line B-B', in accordance with the teachings of the present invention.
Figure 1A:
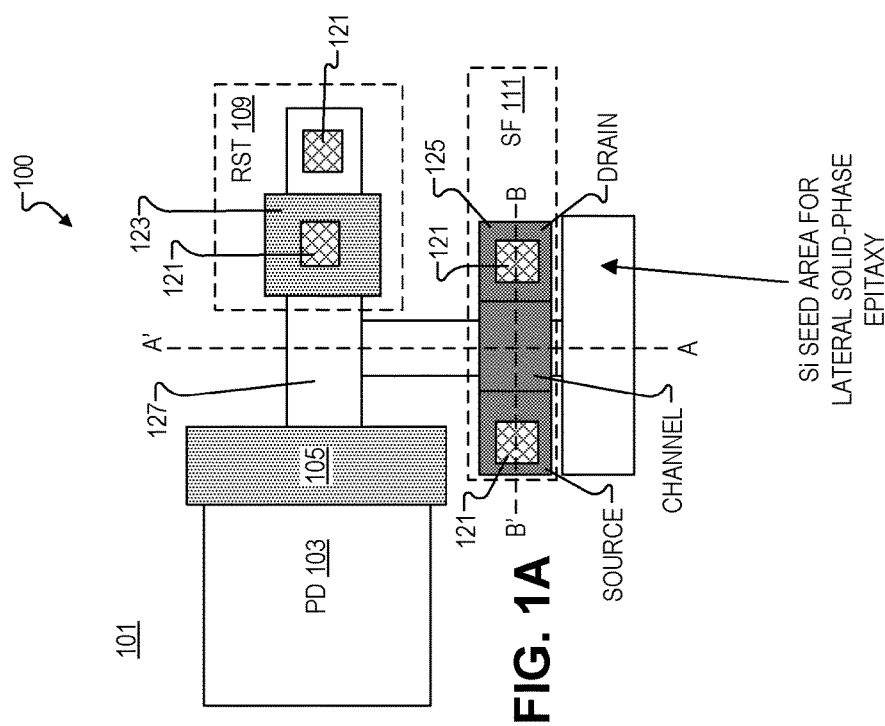
FIG. 1A is a top-down illustration of an example image sensor, in accordance with the teachings of the present invention.

FIG. 1A is a top-down illustration of an example image sensor 100. Image sensor 100 includes first semiconductor material 101 (as illustrated in FIGS. 1B-1C), photodiode 103, transfer transistor 105, floating diffusion 127, reset gate 109 (including contacts 121, and gate electrode 123), and source follower transistor 111 (including second semiconductor material 125, and contacts 121).

As shown in the illustrated example, photodiode 103 is disposed in first semiconductor material 101, and floating diffusion 127 is disposed proximate to photodiode 103 in first semiconductor material 101. Transfer transistor 105 is electrically coupled between photodiode 103 and floating diffusion 127 to transfer image charge from photodiode 103 to floating diffusion 127 in response to a transfer signal applied to transfer transistor 105. Additionally, reset gate 109 is electrically coupled to floating diffusion 127, and in response to a reset signal, reset gate 109 resets image charge in floating diffusion 127. Two contacts 121 are coupled to the reset gate 109: one contact coupled to the gate electrode 123, and the other contact coupled to the drain electrode. As illustrated, photodiode 103, floating diffusion 127, and reset gate 109 form a substantially "T" shaped structure when viewed from the light incident surface of first semiconductor material 101 (depicted). One of ordinary skill in the art will appreciate that image sensor 100 may be backside or frontside illuminated.

Source follower transistor 111 is disposed in part in second semiconductor material 125. In the illustrated example, second semiconductor material 125 of the source follower transistor 111 is disposed proximate to a surface of first semiconductor material 101, and may be oriented orthogonally to a portion of floating diffusion 127 which extends underneath second semiconductor material 125. In one example, second semiconductor material 125 may include a single semiconductor crystal (e.g., single crystal Si) formed by using the crystal structure of first semiconductor material 101 in the seed area as a template for single crystal growth. In one example, both the gate electrode of transfer transistor 105 and gate electrode 123 of reset gate 109 may include polysilicon, and second semiconductor material 125 may start as polysilicon but may be converted to a single crystal via lateral solid phase epitaxy. The specific device geometries of source follower transistor 111 will be discussed in greater detail in connection with FIGS. 1B-1C.

FIG. 1B is a cross sectional illustration of image sensor 100 in FIG. 1A as cut along line A-A'. As shown, dielectric material 133 (e.g., SiO$_2$, HfO$_2$ or the like) is disposed between first semiconductor material 101 and second semiconductor material 125. Moreover, shallow trench isolation structures 131 surround floating diffusion 127 at least in part, and may be used to electrically isolate individual pixels in the image sensor system (see e.g., FIG. 2 for imaging system). These structures may be useful to prevent electrical crosstalk and subsequent image quality degradation. Further, shallow trench isolation structures 131, or other isolation structures, may surround the entire pixel in some examples of the present disclosure.

FIG. 1C is a cross sectional illustration of image sensor 100 in FIG. 1A as cut along line B-B'. As shown source follower transistor 111 includes first doped region 125A (source), third doped region 125C (drain), and second doped region 125B (channel, with an opposite polarity as first doped region 125A and third doped region 125C). Second doped region 125B is laterally disposed between first doped region 125A and third doped region 125C. The gate electrode of source follower transistor 111 is disposed in first semiconductor material 101 proximate to second doped region 125B (and may be an extension of floating diffusion 127, or its own separate doped gate structure coupled to floating diffusion 127, in accordance with the teachings of the present disclosure). As shown, source follower transistor 111 may be an N-P-N device: first doped region 125A and third doped region 125C are n-type, and second doped region 125B is p-type. While in other examples source follower transistor 111 may be a P-N-P device, in which case the polarities of the three regions are reversed. In the illustrated example, first electrical contact 121 and second electrical contact 121 are electrically coupled to first doped region 125A and third doped region 125B, respectively. Moreover, insulating buffers 135 are disposed on edges of second semiconductor material 125, and the gate electrode of source follower transistor 111 is surrounded at least in part by shallow trench isolation structures 131.

In other image sensor devices, high light signals may be stored on the floating diffusion. In conventional CMOS devices, a contact to the Si is required for the floating diffusion to couple its signal to a source follower transistor. This contact can cause dark current and defect pixels. The structure depicted here solves these problems by forming an inverted source follower transistor 111. Thus, as shown, the floating diffusion 127 (or a distinct gate region coupled to floating diffusion 127) of the pixel extends under the source follower active region and functions as the gate electrode of the source follower transistor 111. This avoids the need for a silicon contact on the floating diffusion 127, and can therefore avoid high dark current and defect pixels associated with contact formation in Si.

Figure 2:
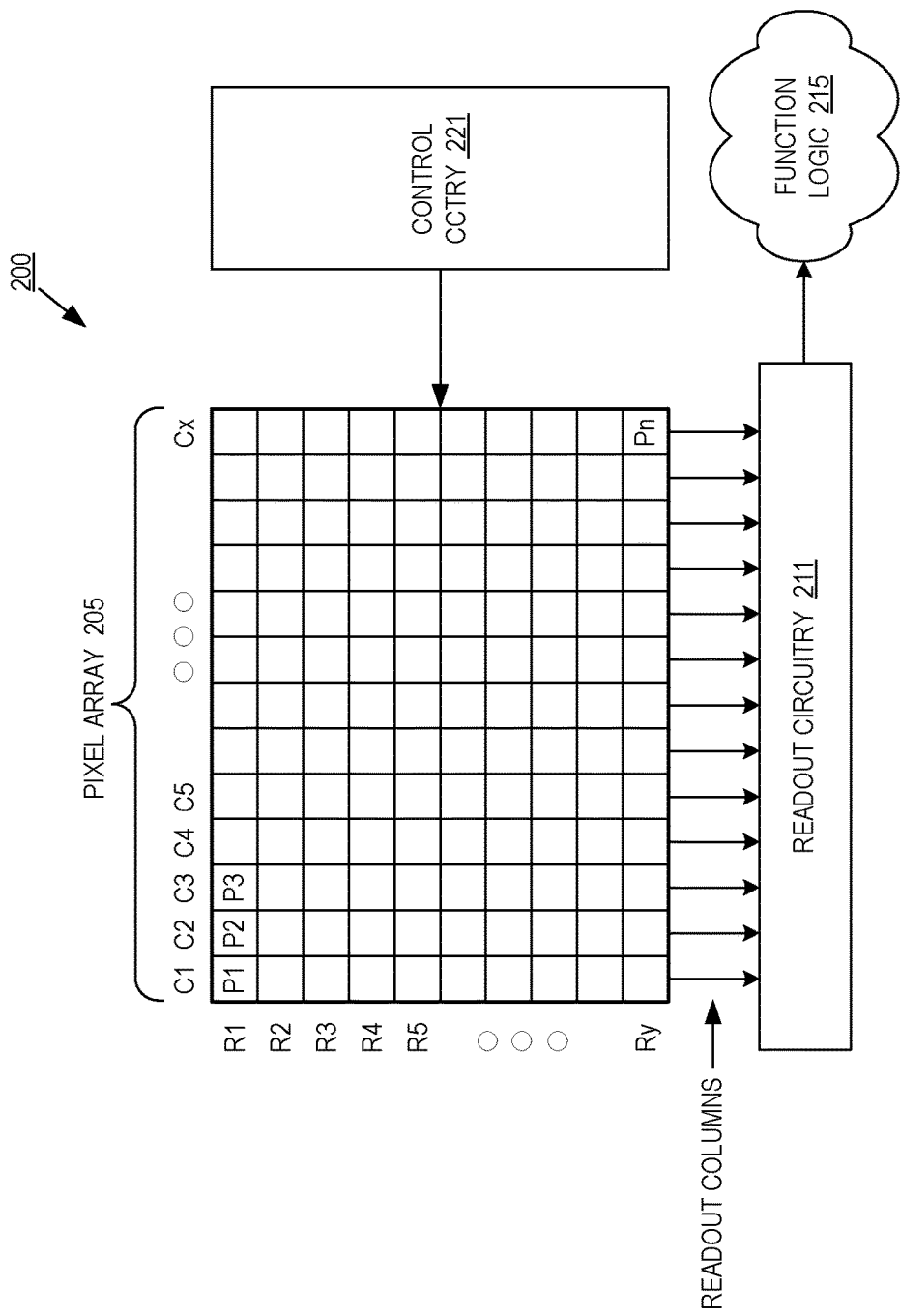
FIG. 2 is a block diagram illustrating one example of an imaging system which may include the image sensor of FIGS. 1A-1C, in accordance with the teachings of the present invention.

FIG. 2 is a block diagram illustrating one example of an imaging system which may include the image sensor of FIGS. 1A-1C. Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 205 has acquired its image data or image charge, the image data is readout by readout circuitry 211 and then transferred to function logic 215. In various examples, readout circuitry 211 may include amplification circuitry, analog-to-digital (ADC) conversion circuitry, or otherwise. Function logic 215 may simply store the image data or even manipulate the image data by applying post image effects (e.g., crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. For example, control circuitry 221 may generate a shutter signal for controlling image acquisition. In the depicted example, the shutter signal is a global shutter signal for simultaneously enabling all pixels within pixel array 205 to simultaneously capture their respective image data during a single acquisition window. In another example, image acquisition is synchronized with lighting effects such as a flash.

In one example, imaging system 200 may be included in a digital camera, cell phone, laptop computer, automobile or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

Figure 3:
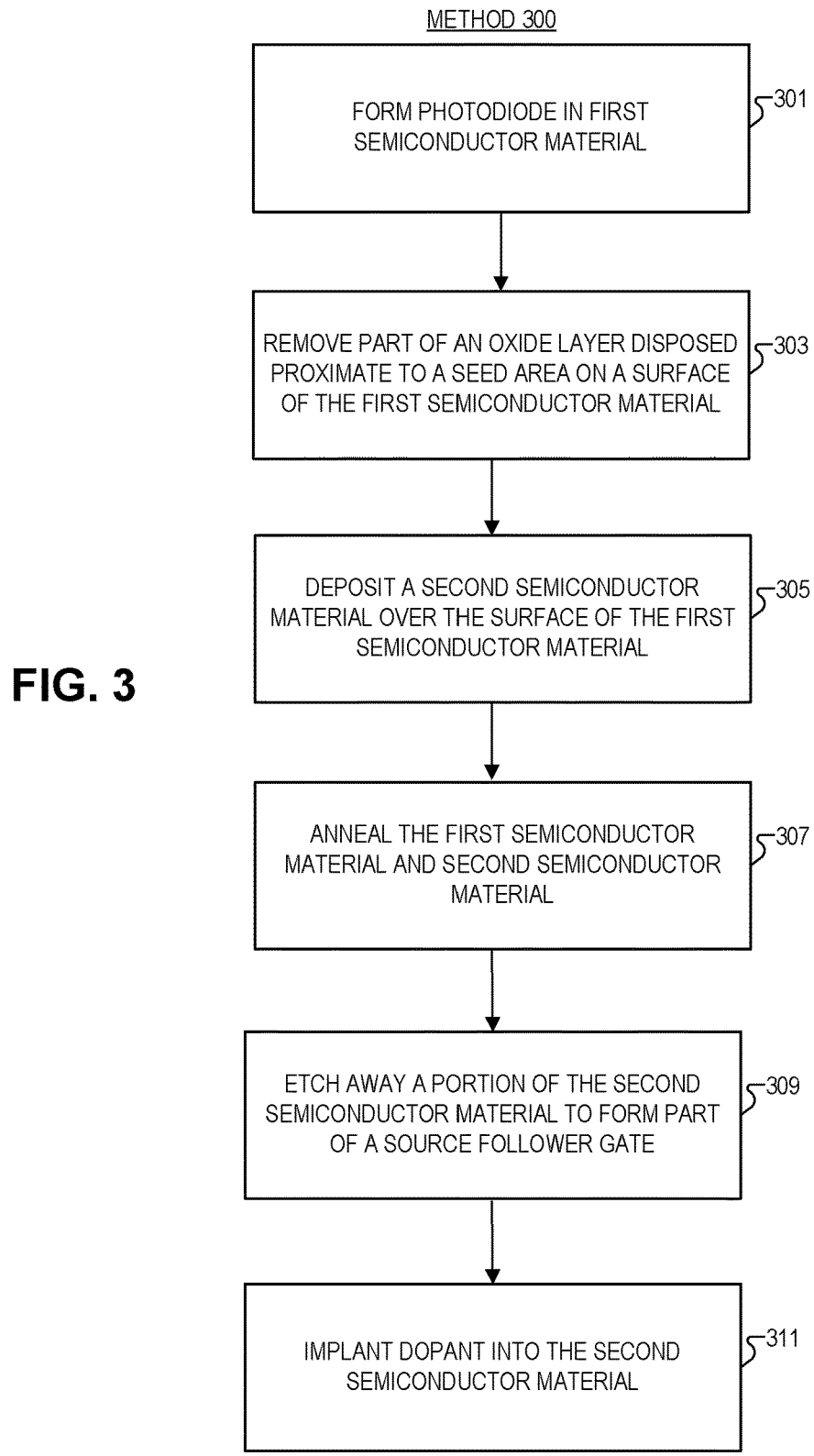
FIG. 3 illustrates an example method of image sensor fabrication, in accordance with the teachings of the present invention.

FIG. 3 illustrates an example method 300 of image sensor fabrication. The order in which some or all process blocks appear in method 300 should not be deemed limiting. Rather, one of ordinary skill in the art having the benefit of the present disclosure will understand that some of method 300 may be executed in a variety of orders not illustrated, or even in parallel. Furthermore, method 300 may omit certain process blocks in order to avoid obscuring certain aspects. Alternatively, method 300 may include additional process blocks that may not be necessary in some embodiments/examples of the disclosure.

Process block 301 shows forming a photodiode in a first semiconductor material. In some examples (like those depicted in FIG. 2) many photodiodes may be constructed in a semiconductor wafer to form a photodiode array. In one example, while dopant is implanted in the first semiconductor material to form all or some of the photodiode, a floating diffusion may be formed in the first semiconductor material. Similarly, a transfer transistor may be formed between the photodiode and the floating diffusion, which may be electrically coupled to transfer image charge from the photodiode to the floating diffusion. Additionally, shallow trench isolation structures may be formed in first semiconductor material before, or contemporaneously with, the photodiodes.

After some of the device architecture is formed in the first semiconductor material, an oxide layer may be deposited or grown (e.g., from oxidizing the semiconductor material or the like) on the surface of the first semiconductor material. The oxide material may include $SiO_2$, $HfO_2$ or similar dielectric materials.

Process block 303 discloses removing part of the oxide layer disposed proximate to a seed area (see e.g., FIG. 1A) on a surface of the first semiconductor material. In this example, the seed area may be used to grow a single crystal source follower active region by using the crystal structure of the underlying semiconductor to grow the single crystal. Removing part of the oxide may be accomplished with a wet etch or the like.

Process block 305 illustrates depositing a second semiconductor material over the surface of the first semiconductor material. In other words a second layer of semiconductor material may be deposited on the oxide surface of the first semiconductor material. Thus the oxide layer is disposed between the first semiconductor material and the second semiconductor material. However, part of this second semiconductor material may contact the exposed seed area so the second semiconductor material and the first semiconductor material are in contact (at least in the seed area). In some examples, the second semiconductor material is formed by solid lateral phase epitaxy.

Process block 307 shows annealing the first semiconductor material and the second semiconductor material. This allows for the crystals in the second semiconductor material—formed during the deposition process—to coalesce and form a single crystal. In some examples, annealing occurs at 600° C.-700° C. for 5-20 hours.

After annealing the first and second semiconductor materials, photolithography patterning and dry etching may take place to reduce the thickness of the second semiconductor material to be the same as other pieces of device architecture formed proximate to the surface of the first semiconductor material.

Process block 309 discloses etching away a portion of the second semiconductor material to form part of a source follower transistor. This etching separates the active region of the source follower transistor from the first semiconductor material, allowing the floating diffusion disposed in the first semiconductor material to act as the gate electrode of the source follower transistor. Moreover, the oxide layer may function as a gate dielectric between the gate electrode and the second semiconductor material.

Process block 311 illustrates implanting dopant into the second semiconductor material to form a first doped region, a third doped region, and a second doped region with an opposite polarity as the first doped region and the third doped region. In other word, implanting dopant may be used to construct an N-P-N or P-N-P junction in the second (single crystal) semiconductor material to form the active region of the source follower transistor. The second doped region may be laterally disposed between the first doped region and the third doped region, and disposed above the floating diffusion/source follower gate so the second doped region functions as the active layer of the source follower transistor.

In some examples, implanting dopant into the second semiconductor material further forms logic circuitry in the first semiconductor material. In other words, the implantation steps may be used to form other pieces of the integrated circuitry in the image sensor (for example, other piece of NMOS logic).

In some examples, electrical contacts may be formed that are electrically coupled to the first doped region and the third doped region, respectively. These contacts may inject/extract charge to/from the second semiconductor material. Thus, the first doped region and third doped region function as a source and drain of the source follower transistor.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method of image sensor fabrication, comprising:
    forming a photodiode and a floating diffusion in a first semiconductor material;
    removing part of an oxide layer disposed proximate to a seed area on a surface of the first semiconductor material;
    depositing a second semiconductor material over the surface of the first semiconductor material;
    annealing the first semiconductor material and second semiconductor material;
    etching away a portion of the second semiconductor material to form part of a source follower transistor; and
    implanting dopant into the second semiconductor material to form a first doped region, a third doped region, and a second doped region with an opposite polarity as the first doped region and the third doped region, and wherein the second doped region is laterally disposed between the first doped region and the third doped region, and wherein the second doped region is a channel of the source follower transistor and is vertically aligned with a gate electrode disposed in the first semiconductor material and electrically coupled to the floating diffusion.

2. The method of claim 1, wherein the oxide layer is disposed between the first semiconductor material and the second semiconductor material.

3. The method of claim 1, wherein annealing forms a single crystal in a portion of the second semiconductor material including the first doped region, the second doped region, and the third doped region.

4. The method of claim 3, wherein the portion of the second semiconductor material is formed by solid lateral phase epitaxy.

5. The method of claim 4, wherein annealing occurs at 600° C.-700° C. for 5-20 hours.

6. The method of claim 1, wherein implanting dopant into the second semiconductor material further forms logic circuitry in the first semiconductor material.

7. The method of claim 1, further comprising separating the second semiconductor material from the seed area.

8. The method of claim 1, further comprising forming a transfer transistor coupled to transfer image charge from the photodiode to the floating diffusion.

9. The method of claim 1, wherein the first doped region, the second doped region, and the third doped region form an N-P-N junction, and wherein the first doped region and third doped region are N-type, and the second doped region is P-type and laterally disposed between the first doped region and the third doped region.

10. The method of claim 9, further comprising forming electrical contacts electrically coupled to the first doped region and third doped region, respectively.

* * * * *